United States Patent
Kojima

(10) Patent No.: US 6,922,364 B2
(45) Date of Patent: Jul. 26, 2005

(54) NON-VOLATILE SEMICONDUCTOR MEMORY DEVICE AND ELECTRIC DEVICE WITH THE SAME

(75) Inventor: Masatsugu Kojima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 70 days.

(21) Appl. No.: 10/713,196

(22) Filed: Nov. 17, 2003

(65) Prior Publication Data

US 2005/0047216 A1 Mar. 3, 2005

(30) Foreign Application Priority Data

Sep. 3, 2003 (JP) .................................. 2003-311393

(51) Int. Cl.$^7$ .............................................. G11C 16/04
(52) U.S. Cl. ............................ 365/185.33; 365/185.29; 365/185.22
(58) Field of Search ..................... 365/185.33, 185.29, 365/185.24, 185.22, 200, 185.11

(56) References Cited

U.S. PATENT DOCUMENTS 4,811,294 A * 3/1989 Kobayashi et al. .... 365/185.22
5,691,941 A * 11/1997 Imamiya et al. ......... 365/185.3
6,061,280 A * 5/2000 Aritome ..................... 365/195

FOREIGN PATENT DOCUMENTS

| JP | 8-153398 | 6/1996 |
| JP | 3190031 | 7/2001 |

OTHER PUBLICATIONS

U.S. Appl. No. 10/621,451, filed Jul. 18, 2003, Tanaka.

* cited by examiner

*Primary Examiner*—Connie C. Yoha
(74) *Attorney, Agent, or Firm*—Oblon, Spivak, McClelland, Maier & Neustadt, P.C.

(57) ABSTRACT

A non-volatile semiconductor memory device includes: a cell array having electrically rewritable and non-volatile memory cells arranged to constitute at least one block with a plurality of pages; and a controller for controlling data erase by a page or sub-block with plural and continuous pages in the block, wherein the cell array has an erase control area set therein in which the number of data erase is stored as being expressed by a series of two-value data, the number of "0" data at lower bit side thereof indicating an accumulated value of the number of data erase in a block, and wherein the number of data erase is read out before data erase for a selected page in the block by a check-read operation in which plural pages are simultaneously set at a selected state, and renewed and written into the selected page after data erase.

17 Claims, 11 Drawing Sheets

FIG. 8A

Initial

|    | B31 | B30 |     | B3 | B2 | B1 | B0 |
|----|-----|-----|-----|----|----|----|----|
| P0 | 1   | 1   | --- | 1  | 1  | 1  | 1  |
| P1 | 1   | 1   | --- | 1  | 1  | 1  | 1  |
| P2 | 1   | 1   | --- | 1  | 1  | 1  | 1  |
|    |     |     |  ⟩  |    |    |    |    |
| P31| 1   | 1   | --- | 1  | 1  | 1  | 1  |

FIG. 8B

1st Erase (page P0)

|    | B31 | B30 |     | B3 | B2 | B1 | B0 |
|----|-----|-----|-----|----|----|----|----|
| P0 | 1   | 1   | --- | 1  | 1  | 1  | 0  |
| P1 | 1   | 1   | --- | 1  | 1  | 1  | 1  |
| P2 | 1   | 1   | --- | 1  | 1  | 1  | 1  |
|    |     |     |  ⟩  |    |    |    |    |
| P31| 1   | 1   | --- | 1  | 1  | 1  | 1  |

FIG. 8C

2nd Erase  (page P2)

| | B31 | B30 | | B3 | B2 | B1 | B0 |
|---|---|---|---|---|---|---|---|
| P0 | 1 | 1 | ---------- | 1 | 1 | 1 | 0 |
| P1 | 1 | 1 | ---------- | 1 | 1 | 1 | 1 |
| P2 | 1 | 1 | ---------- | 1 | 1 | 0 | 0 |
| | | | ⁾ | | | | |
| P31 | 1 | 1 | ---------- | 1 | 1 | 1 | 1 |

FIG. 8D

32nd Erase  (page P0)

| | B31 | B30 | | B3 | B2 | B1 | B0 |
|---|---|---|---|---|---|---|---|
| P0 | 0 | 0 | ---------- | 0 | 0 | 0 | 0 |
| P1 | 1 | * | ---------- | * | * | * | * |
| P2 | 1 | * | ---------- | * | * | * | * |
| | | | ⁾ | | | | |
| P31 | 1 | * | ---------- | * | * | * | * |

NON-VOLATILE SEMICONDUCTOR MEMORY DEVICE AND ELECTRIC DEVICE WITH THE SAME

CROSS-REFERENCE TO RELATED APPLICATION

This application is based on and claims the benefit of priority from the prior Japanese Patent Application No. 2003-311393, filed on Sep. 3, 2003, the entire contents of which are incorporated herein by reference.

BACKGROUNG OF THE INVENTION

1. Field of the Invention

This invention relates to a non-volatile semiconductor memory device (EEPROM) and an electric device with the same.

2. Description of Related Art

Currently known EEPROMs are mostly formed of memory cells with floating gates for storing data charge. A cell array of a NAND-type flash memory, which is known as one of such the EEPROMs, is formed of NAND cell units arranged therein, each of which has a plurality of memory cells connected in series. Source and drain diffusion layers of the memory cells in the NAND cell unit are shared with adjacent cells. To increase the capacity of the NAND-type flash memory, it is effective to increase the number of cells in the NAND cell unit, thereby increasing the capacity of a block defined as a group of a plurality of NAND cell units sharing a word line with them.

If only a small amount of data is written in a block of the NAND-type flash memory, the remaining area of the block becomes wasteful. In consideration of this point, in practice, one block is often divided into some file areas, and data control is performed by each file area. However, data erase is usually performed as one block being rendered a data erase unit in the conventional NAND-type flash memory. Therefore, if above described data control is performed, while the above described erasing scheme is used, it takes an extra time for data rewriting.

In detail, assume, for example, that a data A area and data B area are defined in a block. In order to replace the data A by data A', it is required to do copy-write the data B into another block. After this copy-write, block erasure is performed, and then data A' is written into the erased block. Such the need of copy-write for dada B, which is not required to be rewritten, brings an overhead time in data processing.

To decrease such the overhead time in the data rewriting operation, it is effective to do a data erase operation by every page or every sub-block (i.e., group of plural pages which are continued). Such the erase method has already been provided in, for example, Japanese Patent Application Laid Open (kokai) No. 3-295097, Japanese Patent Application Laid Open (kokai) No. 8-143398, and Japanese Patent Application Laid Open (kokai) No. 11-176177.

Page erase may be done by applying 0V to word lines in a selected area, and simultaneously applying an erase voltage to a p-type well on which the cell array is formed, while setting word lines in a non-selected area at a floating state. Under such the condition, stored charge of the respective floating gates is discharged to the channels by FN tunneling in the memory cells in the selected area, whereby an erase state with a low threshold voltage (i.e., data "1" state) is obtained in every selected cell. In the non-selected area, the word lines (i.e., control gates), which are held in a floating state, are boosted by capacitive coupling in accordance with increasing of the erase voltage applied to the p-well to be in an "erase-inhibition" state. Therefore, by use of such the erase method, it becomes possible to do data write for only a selected area in a block, which is required to be rewritten.

In the above described page erase (or sub-block erase), however, there is a problem that an erase stress is applied to cells in a non-selected page. Especially, within the non-selected cells, a large erase stress is applied to cells along a non-selected word line adjacent to a selected word line. This is because that the non-selected word line (in a floating state of, e.g., Vdd) adjacent a selected word line (e.g., 0V) is not boosted to a sufficient erase inhibit voltage under the influence of capacitive coupling therebetween. As cells and interconnections are more miniaturized, and the capacitance between the word lines becomes more larger, the above described influence becomes more greater. In addition, at data write time for a selected page, write stress is applied to non-selected cells because an intermediate voltage is applied to word lines of non-selected pages.

Therefore, repeatedly performing data rewrite by a page (or a sub-block), data disturbance becomes large, and there is generated a risk of data destruction. To prevent cell data from being destroyed, it is required to limit the number of data rewrite operations.

SUMMARY OF THE INVENTION

According to an aspect of the present invention, there is provided a non-volatile semiconductor memory device including:

a cell array having electrically rewritable and non-volatile memory cells arranged to constitute at least one block with a plurality of pages; and a controller for controlling data erase by a page or sub-block with plural and continuous pages in the block, wherein the cell array has an erase control area set therein in which the number of data erase is stored as being expressed by a series of two-value data, the number of "0" data at lower bit side thereof indicating an accumulated value of the number of data erase in a block, and wherein the number of data erase is read out before data erase for a selected page in the block by a check-read operation in which plural pages are simultaneously set at a selected state, and renewed and written into the selected page after data erase.

BRIEF DESCRIPTION OF THE DRAWINGS

FIGS. 8A to 8D show changes of data storing states in the redundant area serving as a storage area for storing the number of data erase.

DETAILED DESCRIPTION OF THE EMBODIMENTS

Illustrative embodiments of this invention will be explained with reference to the accompanying drawings below.

Figure 1:
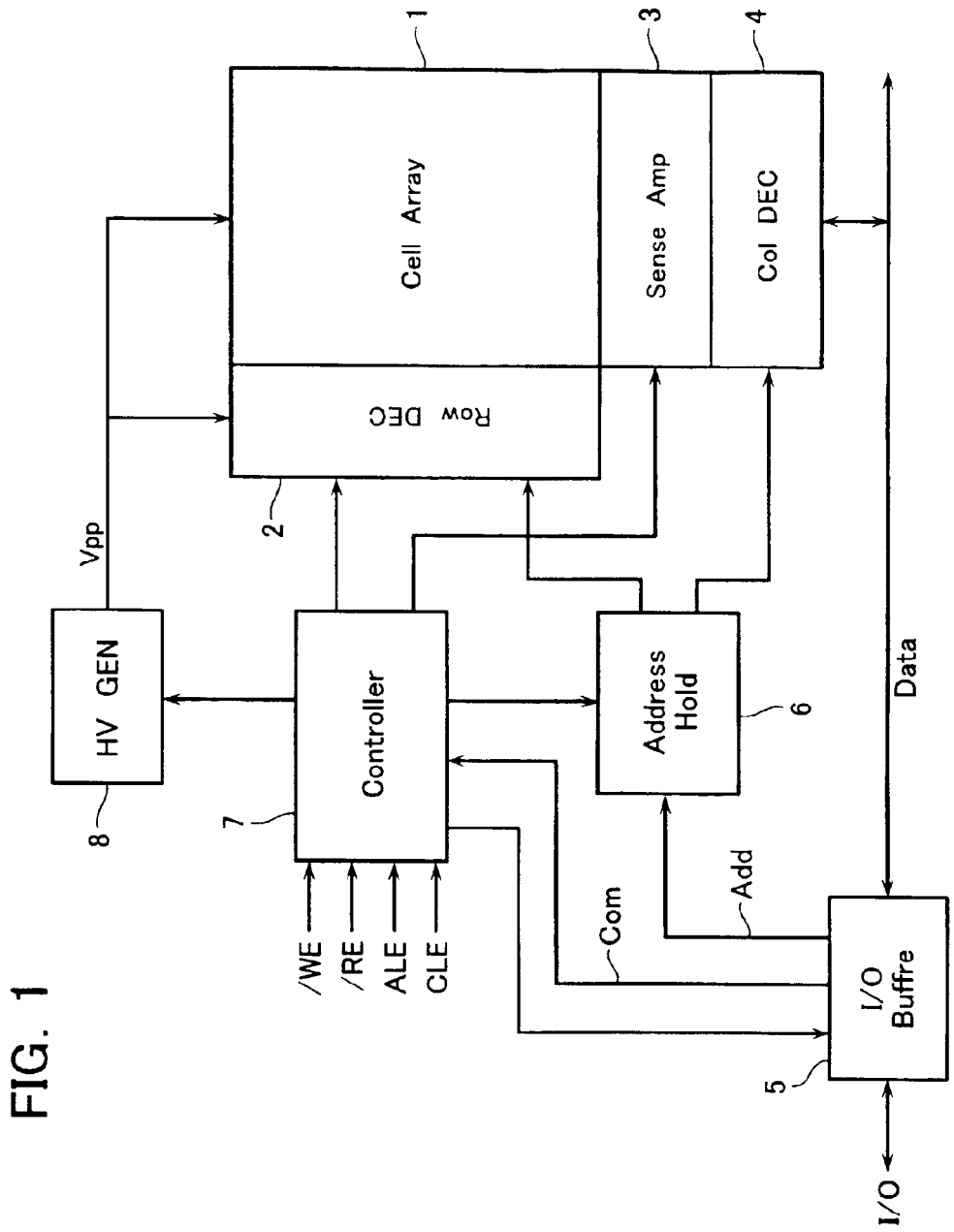
FIG. 1 shows a functional block configuration of a NAND flash memory in accordance with an embodiment of the present invention.

FIG. 1 shows a functional block configuration of a NAND-type flash memory in accordance with an embodiment. Arranging a plurality of floating-gate type memory cells MC0–MC31 in a matrix manner, a cell array 1 is formed. A row decoder circuit (including word line driver) 2 is disposed for driving word lines and select gate lines of the cell array 1. A sense amplifier circuit 3 has sense amplifiers and data latch circuits so as to constitute a page buffer which is used for data writing and reading by a page of the cell array 1.

One page read data in the sense amplifier circuit 3 may be selected by a column decoder (column gates) 4 to be output to the external I/O terminal through an I/O buffer 5. Write data supplied from the I/O terminal is selected by the column decoder 4 to be loaded in the sense amplifier circuit 3. One page write data is loaded in the sense amplifier circuit 3 and held until a data write cycle is finished. Address signal is input to an address hold circuit 6 through the I/O buffer 5 and transferred to the row decoder 2 and column decoder 4.

A controller 7 outputs various internal timing signals used for controlling write and ease sequence in response to external signals such as write enable signal /WE, read enable signal /RE, address latch signal ALE, command latch signal CLE and the like. Based on these internal signals, the controller 7 executes sequence controls of data write and erase, and a data read operation. A high voltage generation circuit 8 generates various high voltages, Vpp, for data writing and erasing under the control of the controller 7.

Figure 2:
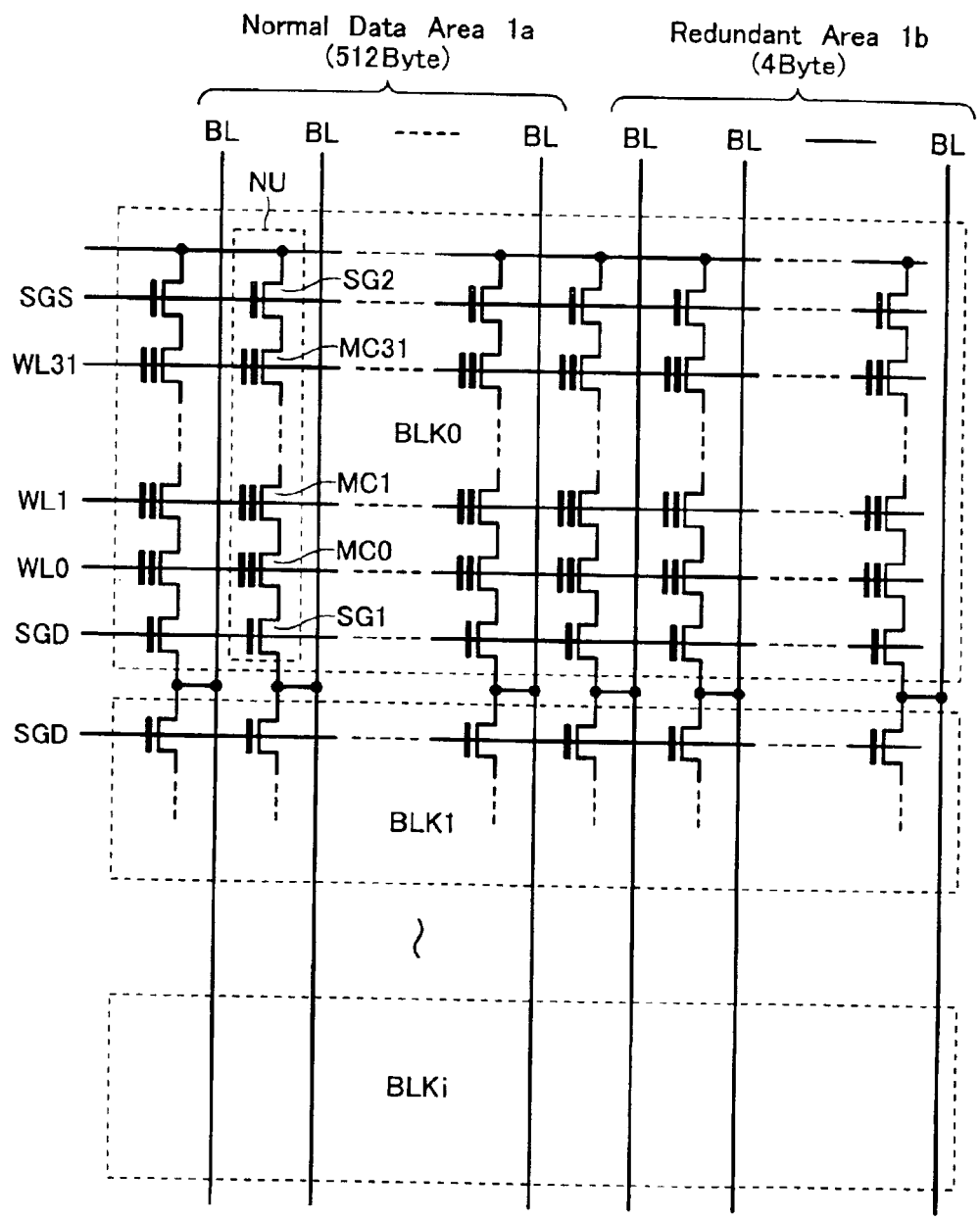
FIG. 2 shows a cell array configuration of the flash memory.

FIG. 2 shows a detailed configuration of the cell array 1. The cell array 1 is formed of NAND cell units NU arranged therein, each of which has a plurality of (thirty two in this example) floating gate-type memory cells MC0–MC31. In detail, the NAND cell unit NU has a cell string in which plural memory cells MC0–MC31 are connected in series, a select gate transistor SG1 disposed between one end thereof and a bit line BL, and another select gate transistor SG2 disposed between the other end and a source line CELSRS. Control gates of the memory cells MC0–MC31 are connected to word lines WL0–WL31, respectively. Gates of the select gate transistors SG1 and SG2 are connected to select gate lines SGD and SGS disposed in parallel with the word lines, respectively. A group of memory cells arranged along a word line serves as one page or two pages. To simplify the explanation, it will be described for a case that the group of memory cells arranged along a word line serves as a page. A group of NAND cell units arranged in the direction of the word line serves as a block. The cell array 1 shown in FIG. 2 has a plurality of blocks BLK0–BLKi arranged in the direction of the bit line BL.

Each page of cell array 1 is divided into a normal data area 1a for storing normal data and a redundant area 1b. The normal data area 1a has a capacity of, for example, 512 Byte per page. The redundant area 1b serves for storing ECC data for correcting an error bit of data stored in the normal data area 1a, logical address, flag for indicating whether a block is defective or not, and "the number of data erase". Note here, it will be described hereinafter for a case that the redundant area 1b serves as only an "erase control area", the capacity of which is necessary for controlling the number of data erase. The number of page erase is sometimes referred to as a "hot count (HC) value". In detail, supposing that maximum value (i.e., permissible value) of the HC value is thirty two (32), the redundant area 1b necessary for storing the HC value is designed to have a capacity of 4 byte(=32 bit).

Figure 3:
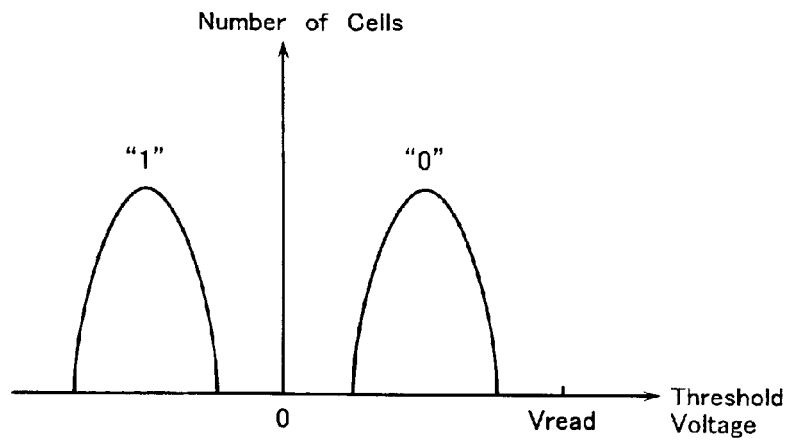
FIG. 3 shows a threshold distribution of data in the flash memory.

Next, write, read and erase operations of the NAND flash memory will be described bellow. Supposing that a two-value data (i.e., binary data) storing scheme is used, each memory cell MC stores, as shown in FIG. 3, data "1" (erase state) defined as a negative threshold state of the cell or data "0" defined as a positive threshold voltage state of the cell. Data write is performed by a page. In detail, based on write data loaded in the sense amplifier circuit 3, precharge bit lines and channels of selected cells continued from the corresponding bit lines at Vdd-Vth ("1" write) and Vss("0" write), where Vth is a threshold voltage of the select transistor SG1. Then apply a boosted write voltage Vpgm to a selected word line. In a cell to which "0" data is applied, electron injection occurs from the channel to the floating gate by FN tunneling, whereby a "0" data state (i.e., positive threshold state) is written. In a cell to which "1" data is applied, electron injection does not occur as a result of channel potential boost by capacitive coupling. As described above, "0" and "1" are written into selected cells. At the data write time, applying an intermediate voltage Vpass to non-selected word lines in the block, it becomes possible to prevent non-selected cells from being written.

In practice, data write is performed by repeating write cycles each including a write voltage (Vpgm) application and a verify-read for verifying the write state until all write data are completely written. By use of such the write sequence control, the data threshold distribution as shown in FIG. 3 may be obtained.

Data read is done by applying 0V as a read voltage to a selected word line, while applying a pass voltage Vread to non-selected word lines, which enables to turn on cells without regard to cell data, and detecting cell current under the above described bias condition. In detail, the sense amplifier circuit 3 precharges the bit line at Vdd, and then detects whether the bit line is discharged or not by the selected cell, thereby sensing data "0" or "1".

Data erase is done by a page in this embodiment. In detail, this "page erase" is done by precharging word lines in non-selected pages (i.e., non-selected word lines) in a selected block to, for example, Vdd, thereby setting them at a floating state, while applying 0V to a word line of a selected page (i.e., selected word line); and simultaneously applying an erase voltage Vera to a p-type well on which the cell array 1 is formed. Under such the erase bias condition, cells of the selected page changes to have a data "1" state (erase state) as a result of electron releasing from the floating gates to the channels. In the non-selected pages, floating gates and control gates are boosted by capacitive coupling from channels, whereby cell data may be retained as it is.

In the embodying NAND type flash memory as described above, a system for controlling the number of page erase (i.e., HC value) is equipped in the chip. In detail, the redundant area 1b serves as an "erase control area" for storing the HC value. The HC value stored in the redundant area 1b is automatically incremented by one every page erase, and renewed HC value is written into a page selected in each page erase. A scheme of HC value control will be explained bellow for a case that maximum HC value, MAX, is set at thirty two.

FIGS. 8A to 8D show HC value writing and renewing operations in the redundant area 1b as expressed by a plane of: 32-page(P0–P31)×32-bit(B0–B31). FIG. 8A shows an initial state of the redundant area 1b; FIG. 8B a state after $1^{st}$ page erase; FIG. 8C a state after $2^{nd}$ page erase; and FIG. 8D a state after $32^{nd}$ page erase. In this embodiment, the HC value is expressed by a series of 32-bit binary data, and the number of "0" at lower bit side in 32-bit, B0–B31, in the last selected page indicates an accumulated HC value (amount of page erase).

As shown in FIG. 8A, the initial state is kept as the redundant area 1b is in an erased state of '1' in its entirety. This indicates HC value=0. From this state, as $1^{st}$ page erase has been performed, for example, for a selected page P0, the lowermost bit B0 of the selected page P0 becomes "0" as shown in FIG. 8B. That is, a renewed HC value(=1) is written in the selected page P0. In the same block, $2^{nd}$ data erase having been performed for page P2, lower two bits, B0 and B1, of the selected page P2 become to be "0", whereby renewed HC value(=2) is written into the page P2.

As similar to the above described examples, a renewed HC value is written into a selected page of the redundant area 1b every page erase. Supposing that final page erase (i.e., $32^{nd}$ page erase) has been done for page P0 in the same block, the selected page P0 of the redundant area 1b becomes, as shown in FIG. 8D, to a state that 32-bit, B0–B31, are "0" in its entirety, thereby indicating that HC value reached to the maximum value of MAX=32.

Figure 4:
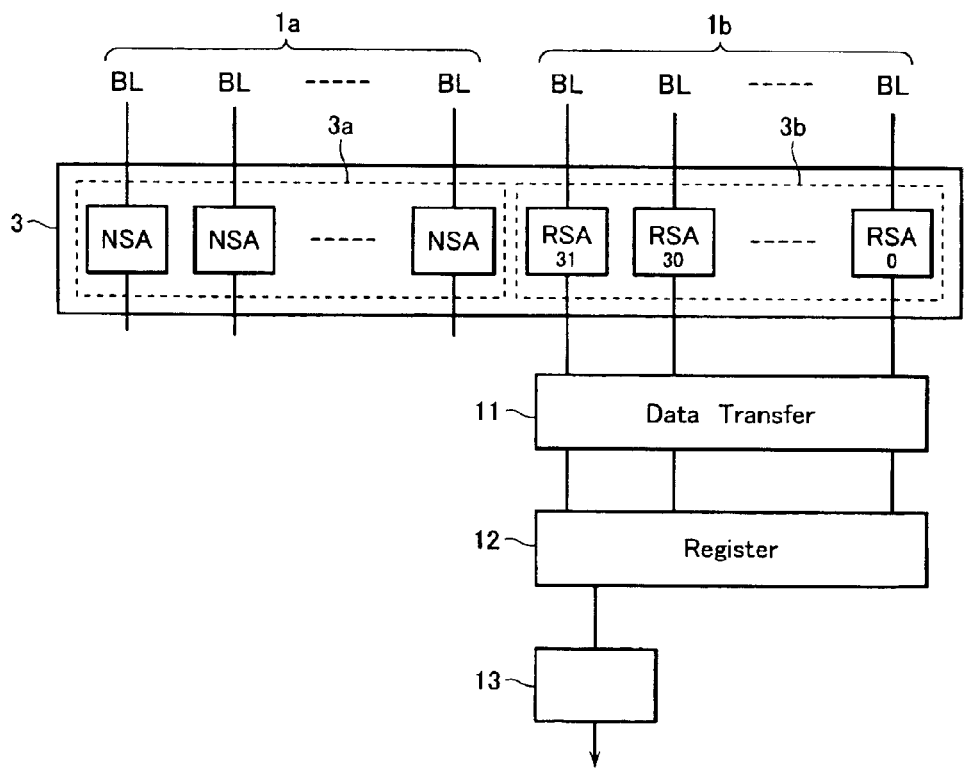
FIG. 4 shows a sense amplifier circuit and a control system for controlling the number of data erase.

FIG. 4 shows a configuration of the above described HC control system. The sense amplifier circuit 3 serving as a page buffer consists of a normal sense amplifier circuit 3a corresponding to the normal cell array 1a and a redundant sense amplifier circuit 3b corresponding to the redundant cell array 1b. The redundant sense amplifier circuit 3b has 32-sense amplifiers, RSA0–RSA31, for reading and writing 32-bit HC value.

In every data erase cycle, HC value stored in the redundant area 1b is read out to the redundant sense amplifier circuit 3b for checking it before data erase, and renewed HC value is written into the redundant sense amplifier circuit 3b after data erase. To achieve such the operation, a register circuit 12 is disposed for temporarily storing the HC value read in the redundant sense amplifier circuit 3b. A data transfer circuit 11 is disposed between the redundant sense amplifier circuit 3b and the register circuit 12. This circuit 11 functions for, not only transferring HC value, but also renewing the read out HC value by adding one to it. A judgment circuit 13 is disposed for judging whether the read out HC value reached to the permissible maximum value or not.

Figure 5:
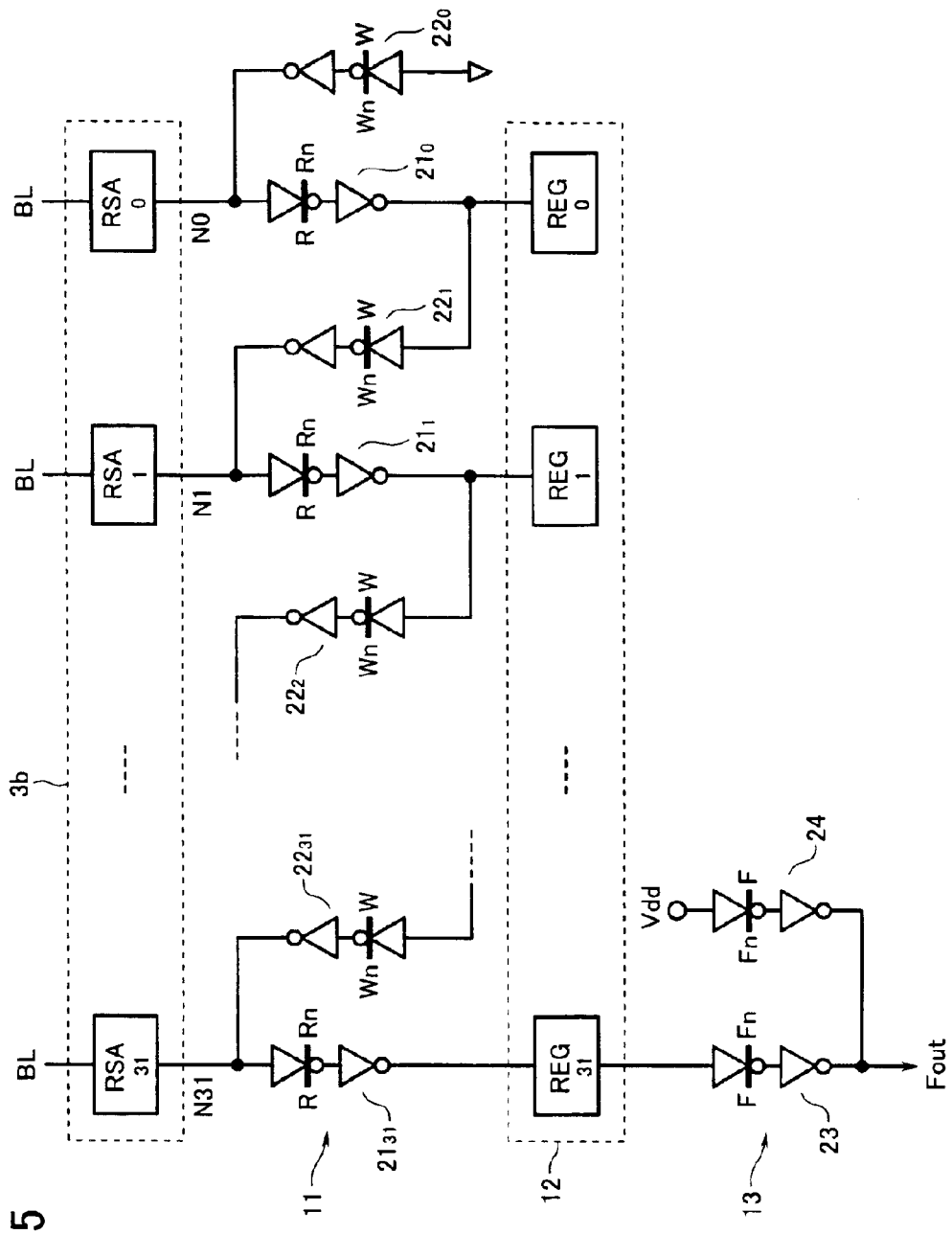
FIG. 5 shows a detailed configuration of the control system.

FIG. 5 shows a detailed configuration of the data transfer circuit 11, register circuit 12 and judgment circuit 13. The data transfer circuit 11 has read-buffers 21j (j=0, 1, . . . , 31) for transferring 32-bit HC value data read out at nodes Nj of the redundant sense amplifiers RSAj to the corresponding registers REGj in the register circuit 12 in a bit-parallel state. These read-transfer buffers 21j are formed of clocked CMOS buffers which are activated by timing signals R(="H") and Rn(="L"). It should be noted that data of the nodes Nj in the redundant sense amplifiers RSAj are contrary in logic to those of bit line side data nodes. In detail, read and write data on the nodes Nj are "L"(=Vss) and "H"(=Vdd) in accordance with cell data "0" and "1", respectively.

The transfer circuit 11 further has write-transfer buffers 22j for incrementing the HC value read out to the register circuit 12 to write back into the redundant sense amplifiers RSAj. These write-transfer buffers 22j are formed of clocked CMOS buffers which are activated by timing signals W(="H") and Wn(="L"). These write-buffers 22j are arranged to transfer data of registers REGj in a way as the data being shifted toward upper bit side one by one.

In detail, the write-buffer 220 corresponding to the lowermost bit has input and output nodes, the former being fixed at Vss, while the latter being connected to node N0 of the redundant sense amplifier RSA0. Input nodes of the remaining write buffers 22j(j=1, 2, . . . , 31) are connected to registers REGj-1, and output thereof to nodes Nj of the redundant sense amplifiers RSAj.

Employing such the configuration of write-buffers 22j, Vss (i.e., write data "0") is transferred every time to the node N0 of the redundant sense amplifier RSA0 corresponding to the lowermost bit of HC value. In addition, "0" data in the HC value read out to the register circuit 12 are shifted to the upper bit side one by one and written back into the redundant sense amplifiers RSAj. As a result, the HC data of the redundant area 1b read out to the redundant sense amplifier circuit 3b is renewed as "0" data bits therein being incremented by one after page erase.

The judgment circuit 13 is a comparator for judging whether the uppermost bit of the HC data in the redundant area 1b is "0" or "1". This judging circuit 13 has a transfer buffer 23, which is activated by judgment timing signals F="H" and Fn="L" to output the uppermost bit read out to the register REG31 to an output node FOUT, and another transfer buffer 24 which is activated as complementary to the buffer 23 for precharging the output node FOUT.

The transfer buffer 24 has an input node fixed in potential at Vdd(="H"). Letting the judging timing signals be F="H" and Fn="L", respectively, every page erase, as far as the uppermost bit of the HC value is "1"(="H"), the output node FOUT is not discharged and held at "H"(Pass). When the uppermost bit of HC value becomes "0", the output node FOUT will be discharged to be "L"(Fail). This judgment output is output to the external of the memory chip directly or via a status register in the controller 7 as a status flag for indicating "Pass" or "Fail".

Figure 6:
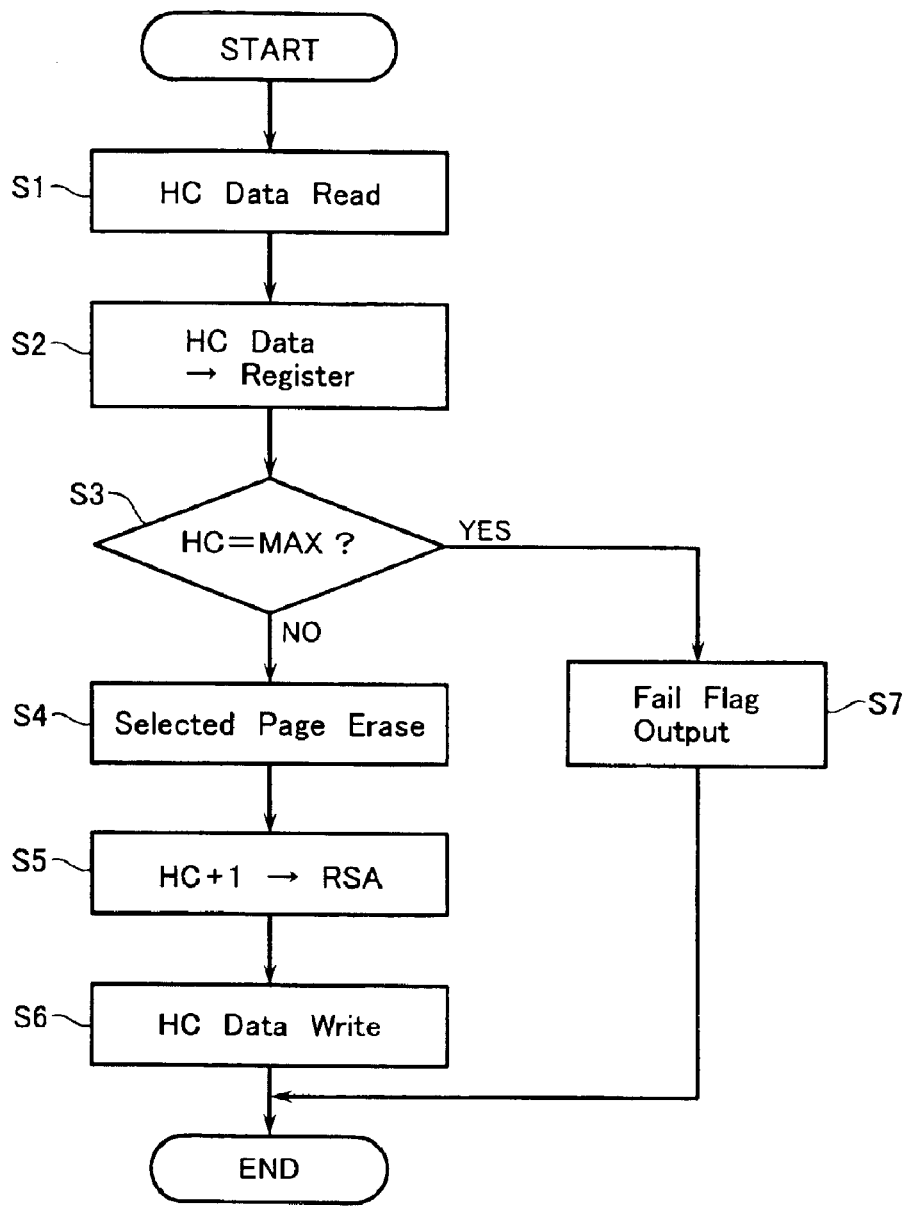
FIG. 6 shows a control flow of data erase of the flash memory.
Figure 7:
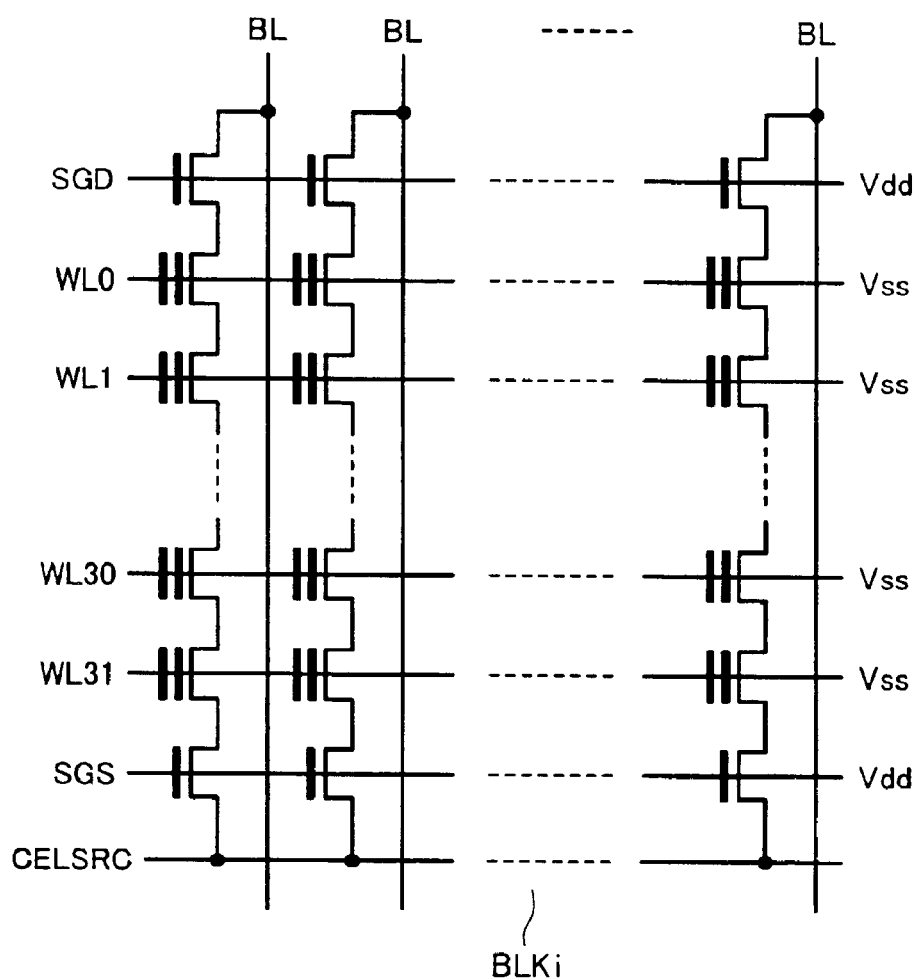
FIG. 7 shows a bias condition at a check read time of the number of data erase.

FIG. 6 shows a control flow of the page erase. A page erase command being supplied, the controller 7 executes check-read of the HC data stored in the redundant area 1b (at step S1). This HC data read is done under the condition that all word lines WL0–WL31 are selected in the selected block BLKi, i.e., Vss is applied to WL0–WL31, and Vdd to the select gate lines SGD, SGS as shown in FIG. 7.

The redundant area 1b is storing, as explained in FIGS. 8A to 8D, the newest HC value in a page, to which the last page erase is performed, as being a state that the number of "0" data bits (off-cells) is greatest in the block. Therefore, performing check-read for the redundant area 1b under the condition that the entire word lines are set at a selected state, the newest HC value in the block may be read out to the redundant sense amplifier circuit 3b. Transfer this read out data to the register circuit 12 via the transfer buffers 21j activated by read timing signals R="H" and Rn="L" (at step S2). And then apply judging signals F="H" and Fn="L" to the judgment circuit 13, and judge whether the accumulated HC value reached to maximum MAX or not (at step S3).

If the judgment result is "NO" (i.e., FOUT="H"), execute data erase for a selected page (at Step S4). Thereafter, increment the HC value and transfer it to the redundant area 1b (at step S5). In detail, applying timing signals W="H" and Wn="L" to the transfer buffer 22j, as explained in FIG. 5, renewed HC data in which "0" data bits are incremented by one is transferred to the redundant sense amplifier circuit 3b as write data. Then write the renewed HC data into the selected page in the redundant area 1b (at step S6), thereby following end of this page erase operation.

If the judgment result at step S3 is "YES" (i.e., FOUT= "L"), the controller 7 outputs a "Fail" flag to the external of the chip without performing data erase (at step S7). User may change the write address to select another block in response to the flag. Alternatively, user may select to perform data refresh of the selected block.

The data refresh is done in a way as to erase the selected block at a time after reading out all data in the normal data area 1a to, for example, an external controller for temporarily sheltering it, or after copy-writing it to another block, and then write the sheltered data into the selected block again. At this time, the redundant area 1b is held at an erase state with all bits are "1" (i.e., the initial state of HC value). As a result, HC value is initialized, and data may be rewritten in a state that accumulated stress due to repeated data erase will be removed.

As above described, according to this embodiment, it is possible to watch and care the number of data erase of each block in the chip, and limit the data erase operation for each block such that the number of data erase is not over a predetermined value. The automatic renewal of the data erase number may be easily controlled. That is, the accumulated value of page erase number is expressed by the number of "0" data bits. When data erase is performed for a selected page, the data erase number is automatically renewed and written into the selected page. The page erase number may be read by only one check-read operation under the condition that all pages in the block are set at a selected state. Read out data of the page erase number is renewed by a bit-shift operation in the transfer buffers and written back. Whether the page erase number reached to the maximum value MAX or not is easily judged based on whether the uppermost bit in the redundant area 1b is "0" or "1".

Although the embodiment described above is for a case that data erase is done by a page, this invention may be applied to another case that data erase is performed by a sub-block defined by continuous and plural pages. The number of sub-block erase (i.e., HC value) may be written into a certain page in the redundant area 1b in a selected sub-block. Check-read operation of HC value, judgment of the HC value and write operation of renewed and accumulated HC vale may be performed as similar to the embodiment described above.

In the above described embodiment, the cell array is formed of a plurality of blocks. In this case, the number erase operations being controlled in a manner that the permissible value (maximum value) thereof is set for each block, it is possible to prevent data rewrite operations from being concentrated on a certain block. However, it should be appreciated that this invention may also be applied to a case in which the cell array is formed of one block.

Furthermore, although the check-read of HC value is, in the above described embodiment, performed under the condition of the whole page selection (i.e., the whole word line selection), it is not necessary to use such the condition, for example, in a case that sub-block unit is fixed. For example, suppose that four word lines constitute a sub-block, and eight sub-blocks constitute a block. In this case, letting HC value be written into the head page of each sub-block, the check-read of the HC value may be done by setting eight word lines corresponding to the head pages of eight sub-blocks at a selected state, and setting the remaining word line at a non-selected state as the pass voltage Vread being applied to them.

This invention may be, in addition, adapted to a case that the number of pages in an erase unit (i.e., sub-block unit) is not fixed, but changed in a block. Suppose that rewrite control is, for example, done in a block as follows: erase four pages, followed by data write for the four pages; next, erase six pages, followed by data write for the six pages; and then, erase two pages, followed by data write for the two pages, and this invention is effective in such the rewrite control. In such the case, HC value may be written at each data erase time as similar to the above described embodiment.

As another embodiment, an electric card using the non-volatile semiconductor memory devices according to the above-described embodiment of the present invention and an electric device using the card will be described bellow.

Figure 9:
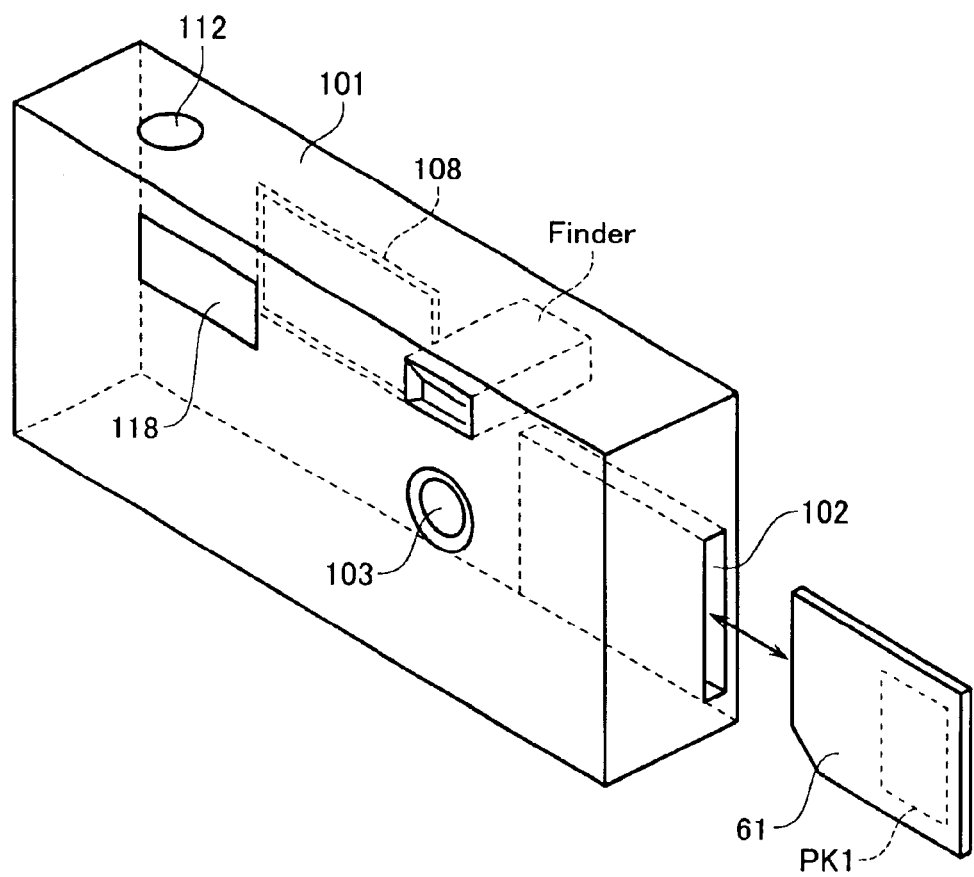
FIG. 9 shows an embodiment applied to a digital camera.

FIG. 9 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 10:
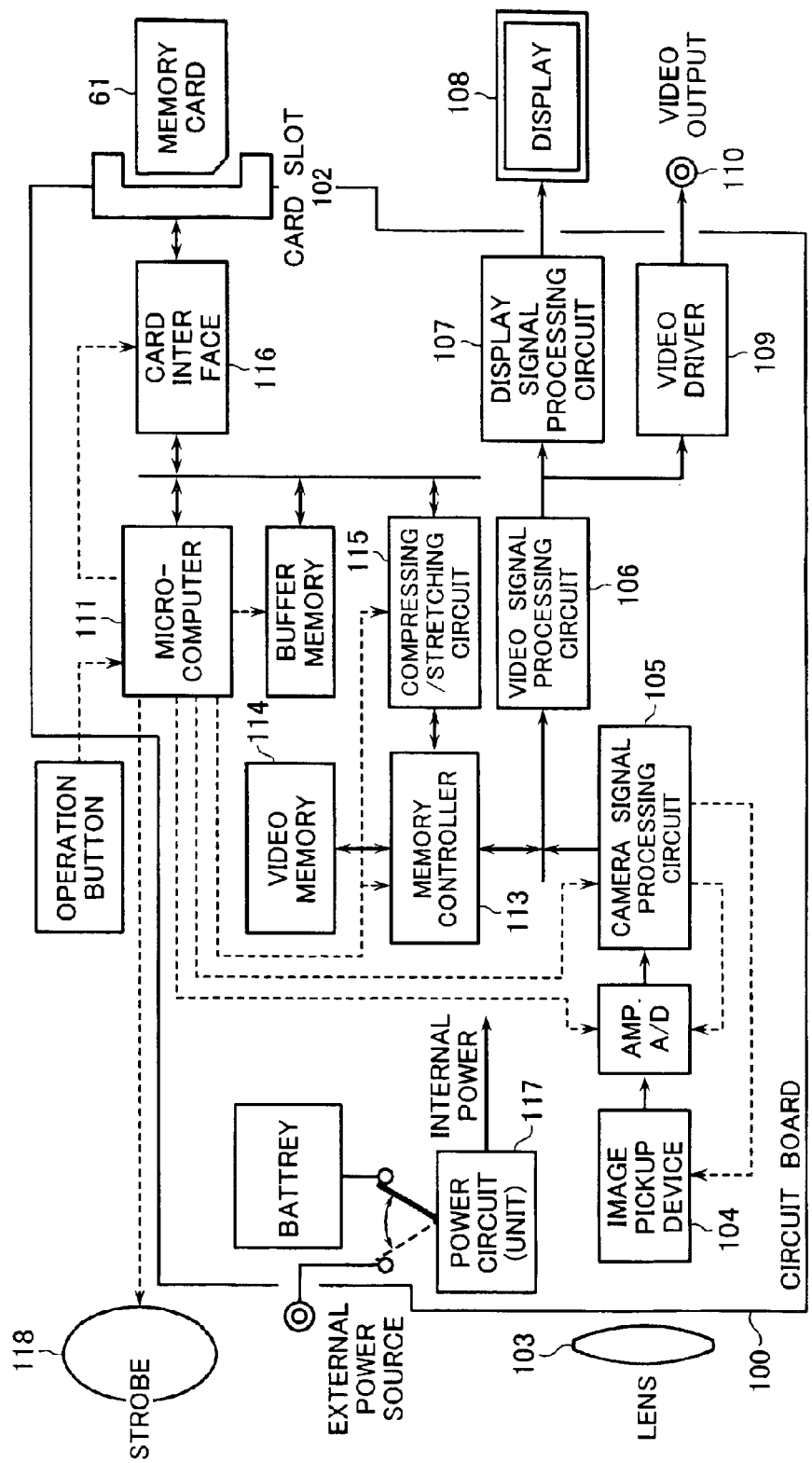
FIG. 10 shows an internal configuration of the digital camera.
Figure 11A:
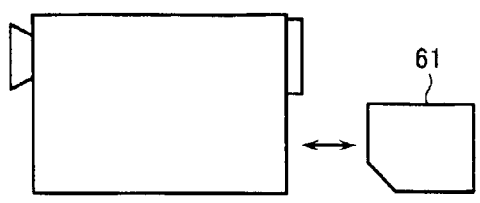
FIGS. 11A to 11J show other embodiments applied to various devices.
Figure 11F:
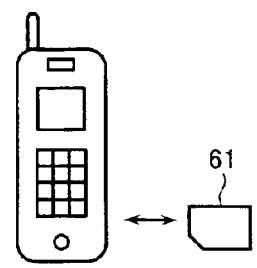
Figure 11B:
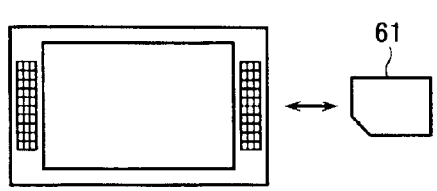
Figure 11G:
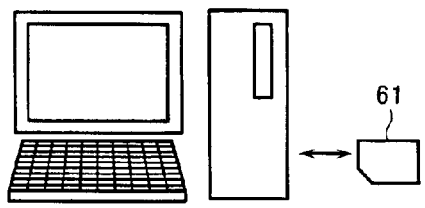
Figure 11C:
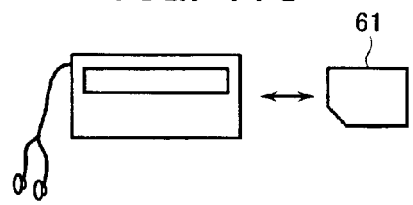
Figure 11H:
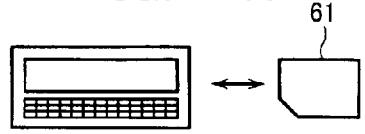
Figure 11D:
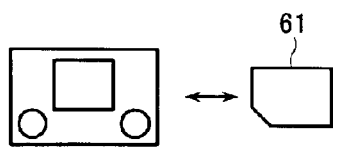
Figure 11I:
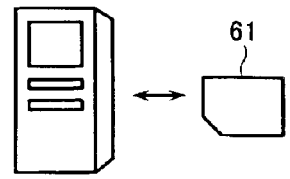
Figure 11E:
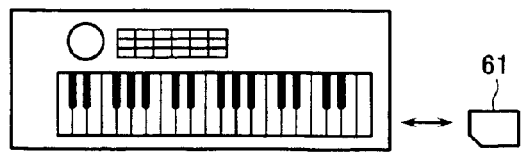
Figure 11J:
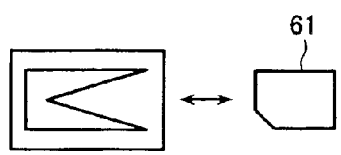

FIG. 10 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC—DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 11A to 11J, as well as in portable electric devices. That is, the electric card can also be used in a video camera shown in FIG. 11A, a television set shown in FIG. 11B, an audio apparatus shown in FIG. 1C, a game apparatus shown in FIG. 1D, an electric musical instrument shown in FIG. 11E, a cell phone shown in FIG. 11F, a personal computer shown in FIG. 11G, a personal digital assistant (PDA) shown in FIG. 11H, a voice recorder shown in FIG. 11I, and a PC card shown in FIG. 11J.

This invention is not limited to the above-described embodiment. It will be understood by those skilled in the art that various changes in form and detail may be made without departing from the spirit, scope, and teaching of the invention.

What is claimed is:

1. A non-volatile semiconductor memory device comprising:
    a cell array having electrically rewritable and non-volatile memory cells arranged to constitute at least one block with a plurality of pages; and
    a controller for controlling data erase by a page or sub-block with plural and continuous pages in the block, wherein
    said cell array has an erase control area set therein in which the number of data erase is stored as being expressed by a series of two-value data, the number of "0" data at lower bit side thereof indicating an accumulated value of the number of data erase in a block, and wherein
    the number of data erase is read out before data erase for a selected page in said block by a check-read operation in which plural pages are simultaneously set at a selected state, and renewed and written into said selected page after data erase.

2. The non-volatile semiconductor memory device according to claim 1, wherein
    said cell array has a normal data area, in which normal data read and write are performed, and a redundant area in which said erase control area is set.

3. The non-volatile semiconductor memory device according to claim 1, further comprising:
    a sense amplifier circuit for data reading and writing by a page of said cell array;
    a register circuit for temporarily holding the number of data erase read in said sense amplifier circuit from said erase control area before data erase;
    a data transfer circuit configured to transfer the number of data erase read in said sense amplifier circuit to said register circuit, and add one to the number of data erase held in said register circuit to renew and transfer it to said sense amplifier circuit; and
    a judgment circuit for judging whether the number of data erase transferred to said register circuit reached to a permissible maximum value or not.

4. The non-volatile semiconductor memory device according to claim 3, wherein
    said data transfer circuit comprises:
    read-transfer buffers activated by a first timing signal to transfer the number of data erase read in said sense amplifier circuit to said register circuit in a bit-parallel state; and
    write-transfer buffers activated by a second timing signal to shift the number of data erase toward upper bit side one by one, and add "0" data serving as the lowermost bit of the number of data erase to renew and transfer the number of data erase to said sense amplifier circuit.

5. The non-volatile semiconductor memory device according to claim 3, wherein
    said judgment circuit is a comparator activated by a third timing signal to determine whether the uppermost bit of the number of data erase is logic "0" or "1".

6. The non-volatile semiconductor memory device according to claim 3, wherein
    an output signal of said judgment circuit is output to external of the chip as a status flag.

7. The non-volatile semiconductor memory device according to claim 1, wherein
    said cell array has NAND cell units arranged therein, each NAND cell unit being formed of plural memory cells connected in series with the respective control gates being connected to different word lines, a group of memory cells connected to a word line serving as one or two pages, a group of NAND cell units arranged in the direction of the word lines serving as a block.

8. An electric card equipped with a non-volatile semiconductor memory device defined in claim 1.

9. An electric device comprising:
    a card interface;
    a card slot connected to said card interface; and
    an electric card defined in claim 8 and electrically connectable to said card slot.

10. The electric device according to claim 9, wherein said electric device is a digital still camera.

11. A non-volatile semiconductor memory device comprising:

a cell array having NAND cell units arranged therein, each NAND cell unit being formed of rewritable and non-volatile memory cells connected in series with the respective control gates being connected to different word lines, a group of memory cells connected to a word line serving as one or two pages, a group of NAND cell units arranged in the direction of the word lines serving as a block, said cell array being divided into a normal data area and a redundant area in the direction of the word lines, the number of data erase accumulated in a block being written into a page last selected for data erase in the block;

a sense amplifier circuit for data reading and writing by a page of said cell array, said sense amplifier having a normal sense amplifier circuit and a redundant sense amplifier circuit disposed corresponding to said normal data area and redundant area, respectively;

a controller for controlling data erase by a page or sub-block with plural and continuous pages in the block;

a register circuit for temporarily holding the number of data erase read in said redundant sense amplifier circuit from said redundant area before data erase;

a data transfer circuit configured to transfer the number of data erase read in said redundant sense amplifier circuit to said register circuit, and add one to the number of data erase held in said register circuit to renew and transfer it to said redundant sense amplifier circuit; and a judgment circuit for judging whether the number of data erase transferred to said register circuit reached to a permissible maximum value or not.

12. The non-volatile semiconductor memory device according to claim 11, wherein the number of data erase stored in said redundant area is expressed by a series of two-value data, the number of "0" data at lower bit side thereof indicating an accumulated value of the number of data erase in a block, and wherein the number of data erase stored in said redundant area is read out to said redundant sense amplifier circuit before data erase for a selected page in said block, by a check-read operation in which plural pages are set at a selected state, and renewed and written back into said redundant sense amplifier circuit after data erase, and then written into said redundant area in said selected page.

13. The non-volatile semiconductor memory device according to claim 11, wherein said data transfer circuit comprises:

read-transfer buffers activated by a first timing signal to transfer the number of data erase read in said redundant sense amplifier circuit to said register circuit in a bit-parallel state; and write-transfer buffers activated by a second timing signal to shift the number of data erase toward upper bit side one by one, and add "0" data serving as the lowermost bit of the number of data erase to renew and transfer the number of data erase to said redundant sense amplifier circuit.

14. The non-volatile semiconductor memory device according to claim 11, wherein said judgment circuit is a comparator activated by a third timing signal to judging whether the uppermost bit of the number of data erase is logic "0" or "1", an output signal thereof being output to external of the chip as a status flag.

15. An electric card equipped with a non-volatile semiconductor memory device defined in claim 11.

16. An electric device comprising:

a card interface;

a card slot connected to said card interface; and an electric card defined in claim 15 and electrically connectable to said card slot.

17. The electric device according to claim 16, wherein said electric device is a digital still camera.

* * * * *